(12) United States Patent
Choi et al.

(10) Patent No.: US 11,581,694 B1
(45) Date of Patent: Feb. 14, 2023

(54) NANOCAVITIES, AND SYSTEMS, DEVICES, AND METHODS OF USE

(71) Applicant: Massachusetts Institute of Technology, Cambridge, MA (US)

(72) Inventors: Hyeongrak Choi, Cambridge, MA (US); Dirk Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 486 days.

(21) Appl. No.: 16/878,046

(22) Filed: May 19, 2020

Related U.S. Application Data

(60) Provisional application No. 62/876,068, filed on Jul. 19, 2019.

(51) Int. Cl.
| | |
|---|---|
| *G01J 3/44* | (2006.01) |
| *H01S 3/0941* | (2006.01) |
| *H01S 3/108* | (2006.01) |
| *G01N 21/65* | (2006.01) |
| *H01S 5/11* | (2021.01) |
| *H01S 3/00* | (2006.01) |
| *B82Y 20/00* | (2011.01) |
| *H01S 3/30* | (2006.01) |

(52) U.S. Cl.
CPC ......... *H01S 3/09415* (2013.01); *B82Y 20/00* (2013.01); *G01J 3/44* (2013.01); *G01N 21/658* (2013.01); *H01S 3/005* (2013.01); *H01S 3/1086* (2013.01); *H01S 3/302* (2013.01); *H01S 5/11* (2021.01); *G01N 2021/651* (2013.01); *G02F 2202/32* (2013.01); *G02F 2203/15* (2013.01); *H01S 2301/02* (2013.01)

(58) Field of Classification Search
CPC ................ G01N 21/64; G01N 21/658; G01N 2021/651; A61B 5/0075; H01S 3/09415; H01S 3/005; H01S 3/1086; H01S 3/302; H01S 5/11; H01S 2301/02; B82Y 20/00; G01J 3/44; G02F 2202/32; G02F 2203/15
See application file for complete search history.

(56) References Cited

U.S. PATENT DOCUMENTS

| | | | |
|---|---|---|---|
| 2002/0000815 A1* | 1/2002 | Fjelstad | G01R 1/07314 324/754.07 |
| 2012/0014837 A1 | 1/2012 | Fehr et al. | |
| 2014/0230884 A1 | 8/2014 | Shapira et al. | |

FOREIGN PATENT DOCUMENTS

| | | |
|---|---|---|
| WO | 2018231962 A1 | 12/2018 |

OTHER PUBLICATIONS

International Search Report and Written Opinion in International Patent Application No. PCT/US2020/033587 dated Oct. 15, 2020, 15 pages.

(Continued)

*Primary Examiner* — Abdullahi Nur
(74) *Attorney, Agent, or Firm* — Smith Baluch LLP

(57) ABSTRACT

Disclosed are dielectric cavity arrays with cavities formed by pairs of dielectric tips, wherein the cavities have low mode volume (e.g., $7 \times 10^{-5} \lambda^3$, where X is the resonance wavelength of the cavity array), and large quality factor Q (e.g., $10^6$ or more). Applications for such dielectric cavity arrays include, but are not limited to, Raman spectroscopy, second harmonic generation, optical signal detection, microwave-to-optical transduction, and as light emitting devices.

24 Claims, 17 Drawing Sheets

(56) References Cited

OTHER PUBLICATIONS

Choi et al., "Self-similar nanocavity design with ultrasmall mode volume for single-photon nonlinearities." Physical review letters 118.22 (2017): 223605. 6 pages.
Hu et al., "Design of photonic crystal cavities for extreme light concentration." ACS photonics 3.9 (2016): 1647-1653.
Jeon et al., "Nanostructured plasmonic substrates for use as SERS sensors." Nano Convergence 3.1 (2016): 1-20.
Raman spectroscopy. Wikipedia last edited Jul. 20, 2020. Accessed at https://en.wikipedia.org/wiki/Raman_spectroscopy on Aug. 20, 2020. 20 pages.

* cited by examiner

Tensed optical fiber

Tapered optical fiber

Grating coupler

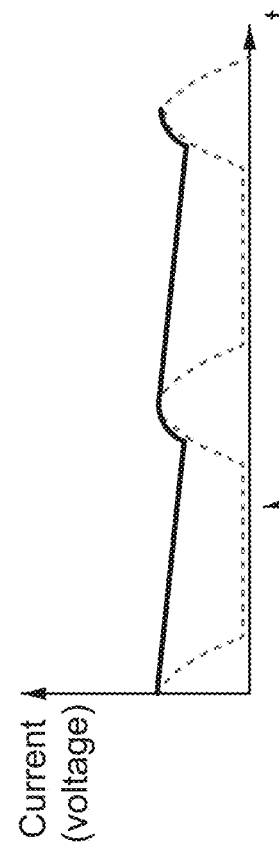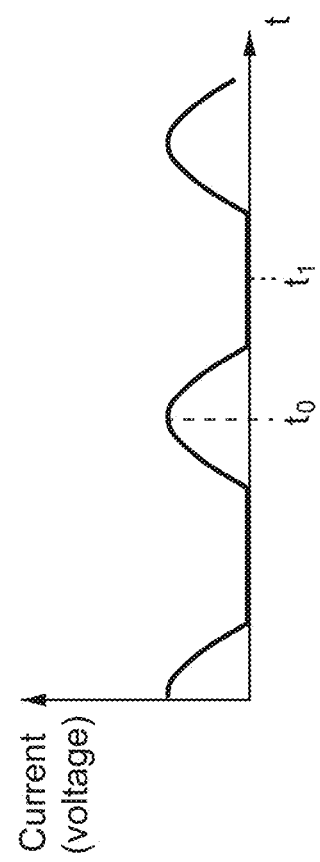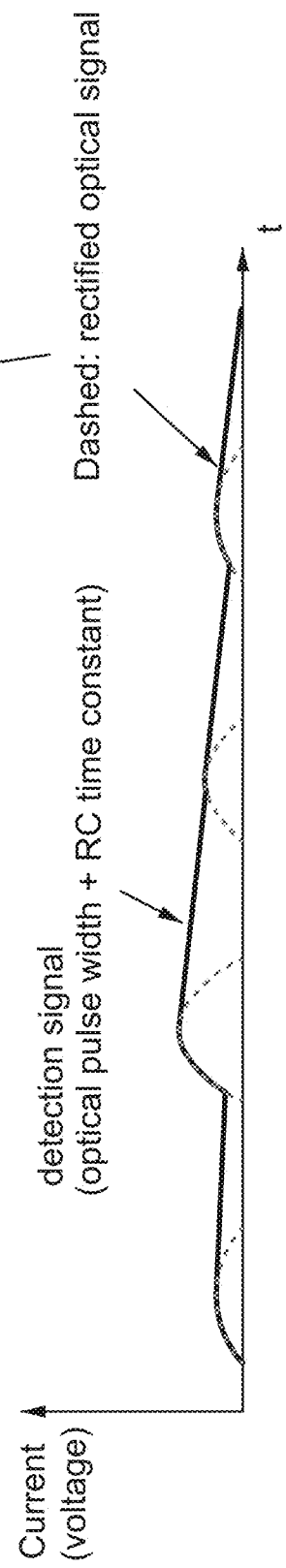
FIG. 6A
FIG. 6B
FIG. 6C

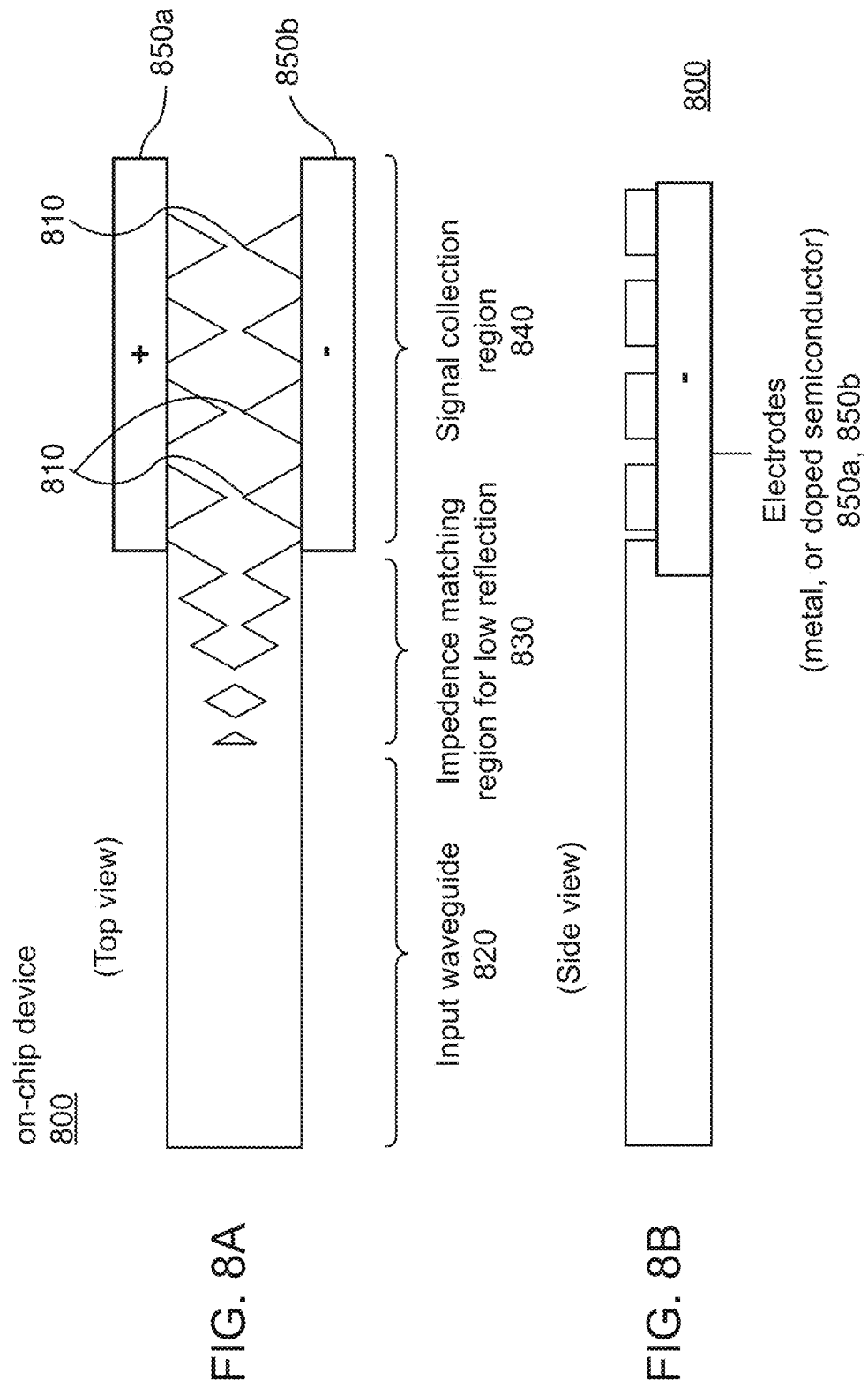

NANOCAVITIES, AND SYSTEMS, DEVICES, AND METHODS OF USE

CROSS-REFERENCE TO RELATED APPLICATIONS

This applications claims priority to U.S. Provisional Application No. 62/876,068 titled "SYSTEMS, DEVICES, AND METHODS USING NANOCAVITIES", filed Jul. 19, 2019, the entire disclosure of which is incorporated by reference.

STATEMENT OF SUPPORT

This invention was made with government support under FA9550-14-1-0052 and FA9550-13-1-0193 awarded by the Air Force Office of Scientific Research. The government has certain rights in the invention.

BACKGROUND

Optical nanocavities with small mode volume ($V_{eff}$) and high quality factor (Q) can greatly increase light-matter interaction and have a wide range of applications. There is hence a continuous need to further decrease $V_{eff}$ and/or increase Q to open new possibilities for applications of optical nanocavities, including nanocavity lasers, cavity quantum electrodynamics, single-molecule spectroscopy, and nonlinear optics. Though there has been some progress, both theoretical and experimental, in optical cavity design and its applications, the Q and $V_{eff}$ of these optical cavities have not yet reached values that can outperform competing technologies. As an example, growing interest in quantum technology and ultrasensitive sensing down to single molecules can require even larger Q and/or smaller $V_{eff}$ than offered by conventional approaches if optical cavities are to be employed.

SUMMARY

A dielectric cavity array is disposed in contact with a sample generating a Raman scattering signal in response to a Raman pump beam. The dielectric cavity array includes a plurality of tips, and a plurality of cavities, each cavity being defined by a pair of tips of the plurality of tips, having a mode volume from about $10^{-2}\lambda^3$ to about $10^{-5}\lambda^3$, and having a quality factor from about $10^3$ to about $10^6$. Each cavity concentrates the Raman pump beam in its vicinity, and enhances the Raman scattering signal generated by the sample in its vicinity.

A system for Raman spectroscopy includes a light source to generate a Raman pump beam to excite a sample, where the sample generates a Raman scattering signal in response to the Raman pump beam. The system also includes a dielectric cavity array disposed in contact with the sample, including a plurality of tips and a plurality of cavities. Each cavity is defined by a pair of tips of the plurality of tips and has a mode volume from about $10^{-2}\lambda^3$ to about $10^{-5}\lambda^3$ and a quality factor from about $10^3$ to about $10^6$. Each cavity concentrate the Raman pump beam in its vicinity, and enhances the Raman scattering signal generated by the sample its vicinity.

A system for second harmonic generation and detection includes a light source to generate a light beam having a wavelength from about 1100 nm to about 2200 nm, and a dielectric cavity array including a plurality of tips and a plurality of cavities. Each cavity is defined by a pair of tips of the plurality of tips and has a mode volume from about $10^{-2}\lambda^3$ to about $10^{-5}\lambda^3$ and a quality factor from about $10^3$ to about $10^6$, to generate a second harmonic frequency light from the light at each cavity. The system further includes a photodetector array coupled to the dielectric cavity array and including a plurality of photodetectors, each photodetector in optical communication with a corresponding cavity, to generate a photocurrent in response to the second harmonic light beam generated at the corresponding cavity.

A system for detecting a light beam includes a first electrode, a first dielectric tip coupled to the first electrode, a second electrode, a second dielectric tip coupled to the second electrode. The first dielectric tip and the second dielectric tip collectively define a first cavity having a mode volume from about $10^{-2}\lambda^3$ to about $10^{-5}\lambda^3$ and a quality factor from about $10^3$ to about $10^6$ to interact with the light. The system also includes a circuit coupled to the first electrode and the second electrode to generate an output signal in response to the modulation of a tunneling current across the first cavity between the first electrode and the second electrode by the light beam.

A system for transducing microwave energy to optical energy includes a resonator to store a microwave photon, and a doubly resonant optical cavity to receive a first optical photon at a first wavelength. The resonator includes a microwave cavity defined by a pair of tips. The microwave cavity has a mode volume from about $10^{-2}\lambda^3$ to about $10^{-8}\lambda^3$, and has a quality factor from about $10^3$ to about $10^6$ to convert, in the microwave cavity, the microwave photon and the first optical photon into a second optical photon at a second wavelength shorter or longer than the first wavelength.

A system includes a light source, which in turn includes a first substrate composed of a p-type semiconductor material and including a first plurality of tips. The light source also includes a second substrate composed of an n-type semiconductor material and including a second plurality of tips. The first substrate and the second substrate are arranged such that the first plurality of tips and the second plurality of tips align to define a plurality of cavities, each cavity having a mode volume from about $10^{-2}\lambda^3$ to about $10^{-5}\lambda^3$ and a quality factor from about $10^3$ to about $10^6$. The light source also includes a first electrode electrically coupled to the first substrate and a second electrode electrically coupled to the second substrate. The system further includes a power source coupled to the first electrode and the second electrode, to apply power to the first electrode and the second electrode. Carrier recombination in the plurality of cavities in response to the application of power generates a light beam.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 6A is a plot illustrating a rectified form of the optical signal of FIG. 5A.

FIG. 6B is a plot illustrating a detection signal generated by the setup of FIG. 5A responsive to the optical signal of FIG. 6A.

FIG. 6C is a plot illustrating a detection signal generated by the setup of FIG. 5A responsive to a pulsed optical signal.

FIG. 8A illustrates a side view of a device for detecting a light beam using a dielectric cavity array.

FIG. 8B illustrates a top view of the device of FIG. 8A.

DESCRIPTION

Aspects disclosed herein can be generally directed to optical nanocavities (also referred to simply as "cavities" sometimes), and applications thereof.

Dielectric Tip Enhanced Raman Spectroscopy

Figure 1A:
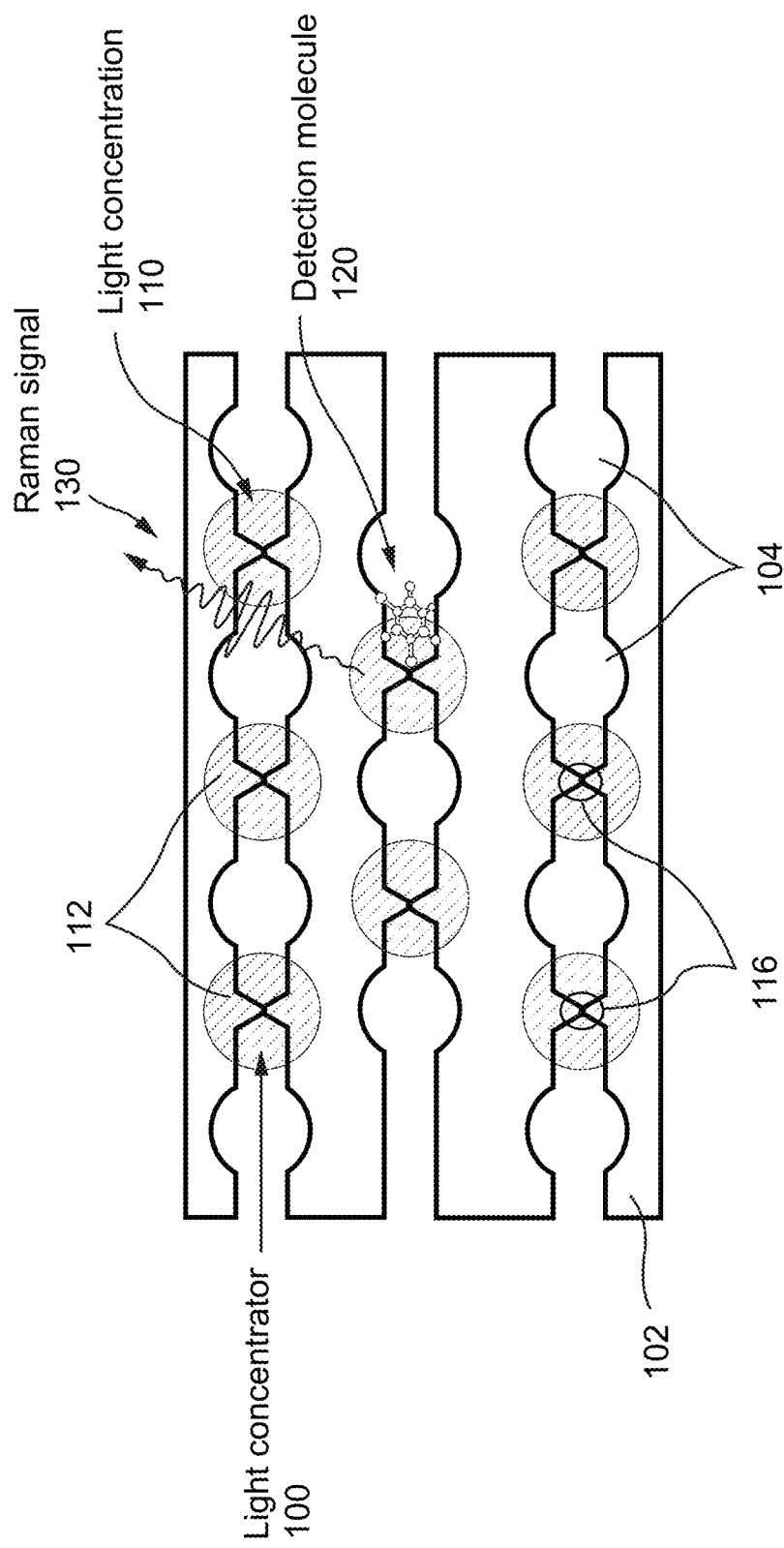
FIG. 1A illustrates a top view of a dielectric cavity array with dielectric tips that define cavities with mode volumes of about $10^{-2}\lambda^3$ to about $10^{-5}\lambda^3$ and quality factors of about $10^3$ to about $10^6$.
Figure 1B:
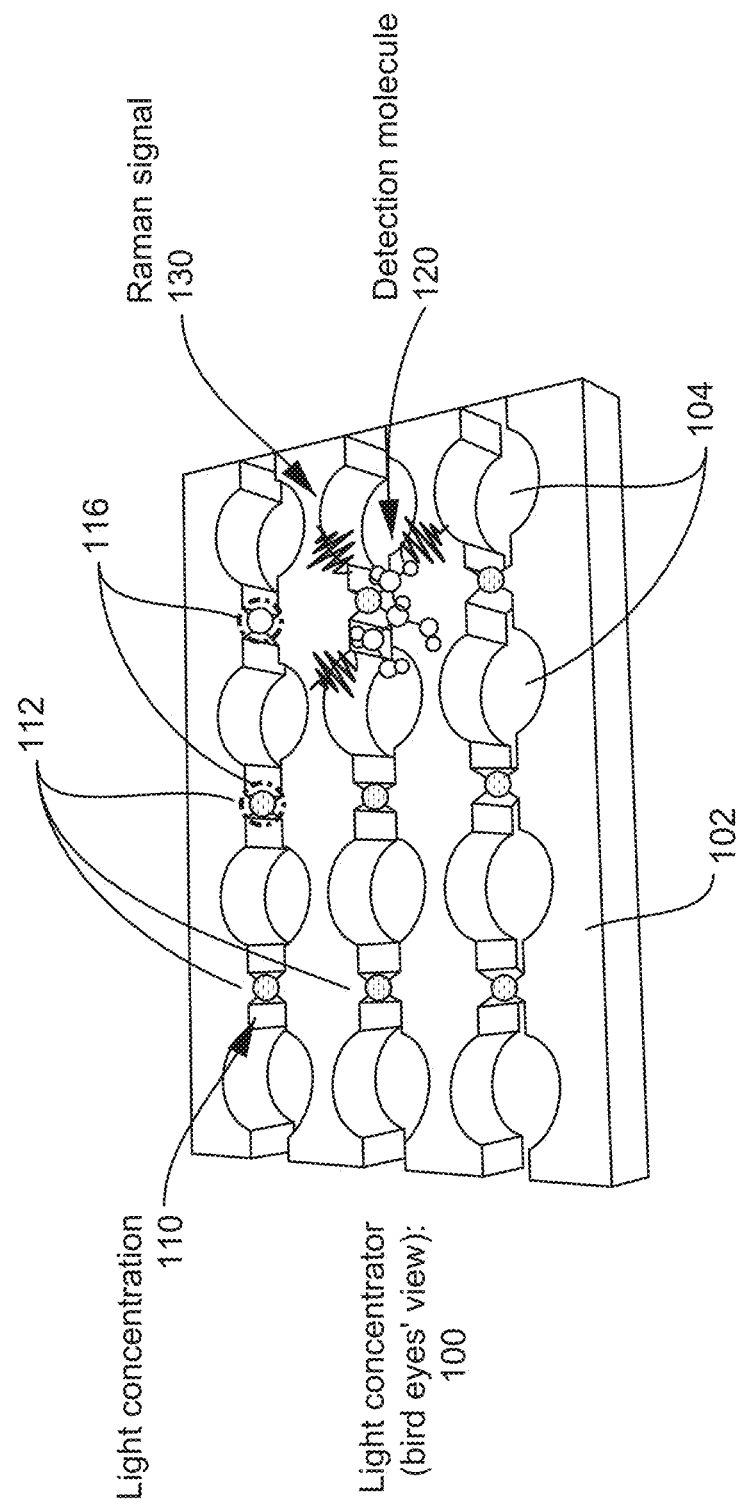
FIG. 1B illustrates a perspective view of the dielectric cavity array of FIG. 1A.

FIG. 1 illustrates photonic crystal/photonic crystal cavity array 100, formed in a substrate 102. The photonic crystal includes holes 104. The array 100 also includes light concentrator cavities 116 within the unit cell/cavity center. Each photonic crystal unit cell/cavity 116 can be defined and/or otherwise bound by an opposing pair of dielectric tips 112. The mode volume of each cavity 116 can be about $10^{-1}\lambda^3$, about $10^{-2}\lambda^3$, about $10^{-3}\lambda^3$, about $10^{-4}\lambda^3$, about $10^{-5}\lambda^3$, about $10^{-6}\lambda^3$, where A is the wavelength of light, including all values and sub-ranges in between. The quality factor Q of each cavity 116 can be about $10^2$, about $10^3$, about $10^4$, about $10^5$, about $10^6$, about $10^7$, including all values and sub-ranges in between.

Without being limited by any theory in particular, introducing the cavities 116, into a PhC cavity array such as the array 100, can achieve a small mode volume (e.g., $7*10^{-5}\lambda^3$, where X is the resonance wavelength of the cavity array), simultaneously with very high Quality Factor Q (e.g., $10^6$). The array 100 can achieve ~$10^4$ times local field enhancement by virtue of its compact, nanophotonic structure, and can function as a very sensitive sensor for a sample, at the single-sample molecule level. Specifically, Surface-enhanced Raman spectroscopy (SERS) is a technique that enhances Raman scattering by rough metal surfaces or nanostructures via the plasmonic effect. Raman scattering is proportional to the fourth power of the local field enhancement (Q/V). The enhancement factor of up to $10^{10}$~$10^{11}$ obtained by the array 100 can allow for detection of Raman scattering from single molecules. Concentrating a Raman excitation/pump beam in this manner in the vicinity of the light concentrator cavity 116 can result in an increased Raman scattering signal from a sample in the vicinity of the cavity, in response. The volume defined by the light concentrator cavity 116 where the Raman excitation is concentrated can be, for example, within which the intensity of the Raman excitation is at least about half its maximum value.

In some cases, the cavity 116 as disclosed herein may be structurally and/or functionally similar to that disclosed in "Self-Similar Nanocavity Design with Ultrasmall Mode Volume for Single-Photon Nonlinearities", Choi et al., Phys. Rev. Lett. 118, 223605, the entire disclosure of which is incorporated herein by reference. Alternatively, a cavity as disclosed herein may be structurally and/or functionally similar to that disclosed in "Design of Photonic Crystal Cavities for Extreme Light Concentration", Hu et al., ACS Photonics 2016, 3, 1647-1653, the entire disclosure of which is incorporated herein by reference.

FIG. 1 also illustrates an example sample molecule 120 to be analyzed that can be present in or in the vicinity of the cavity 116 during a Raman spectroscopic analysis of the sample. The sample 120 can be freely moving (e.g., undergoing Brownian motion), or spatially limited to be in the vicinity of the cavity 116 in any suitable manner such as, for example, adsorption (including physisorption and/or chemisorption), trapping (including dipole trapping, optical trapping such as via optical tweezers, and/or the like), self-association, by virtue of high concentration, and/or the like. When optical tweezers are used, the tip 112/cavity 116 structure can also enhance the intensity of the trapping light beams, further facilitating trapping of the molecules of interest. Also illustrated in FIG. 1 is an excitation/pump beam 130 for Raman excitation of the sample 120 that is concentrated in the area near the cavity 116, thereby increasing the probability and/or magnitude of a response from the sample 120. The sample 120 can generate a detectable Raman scattering signal in response, even for a single sample molecule in the vicinity of a single cavity 116.

Figure 2:
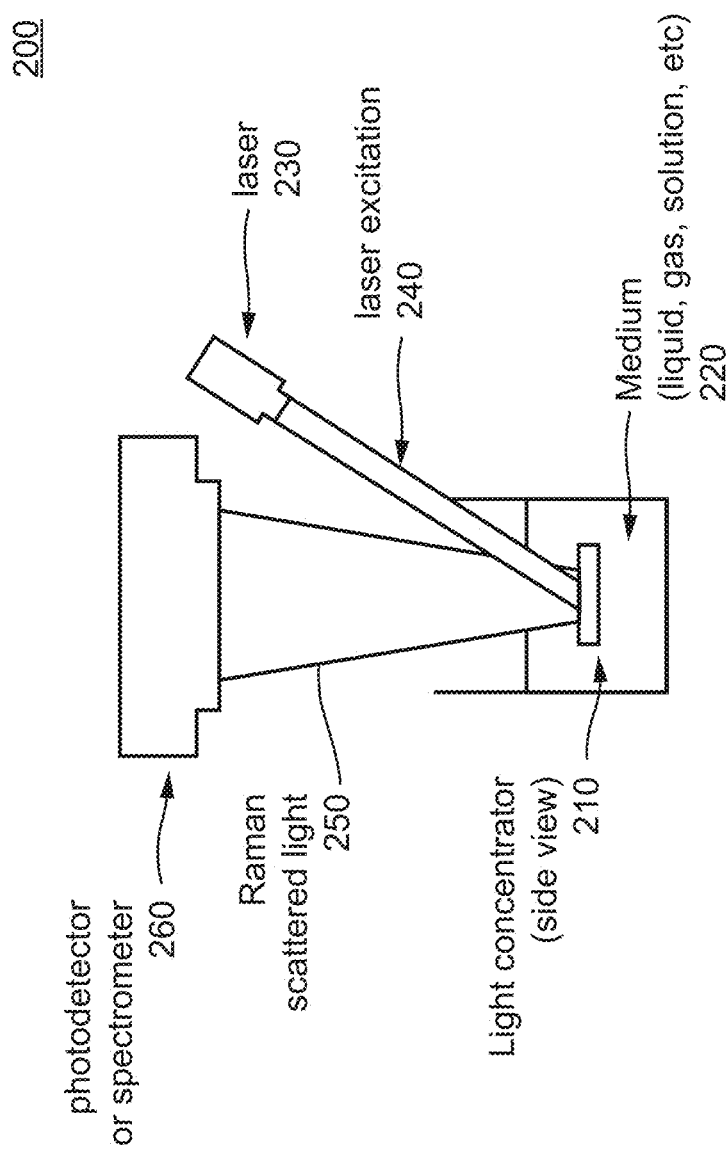
FIG. 2 illustrates a system for Raman spectroscopy using a dielectric cavity array like the one in FIG. 1.
Figure 3A:
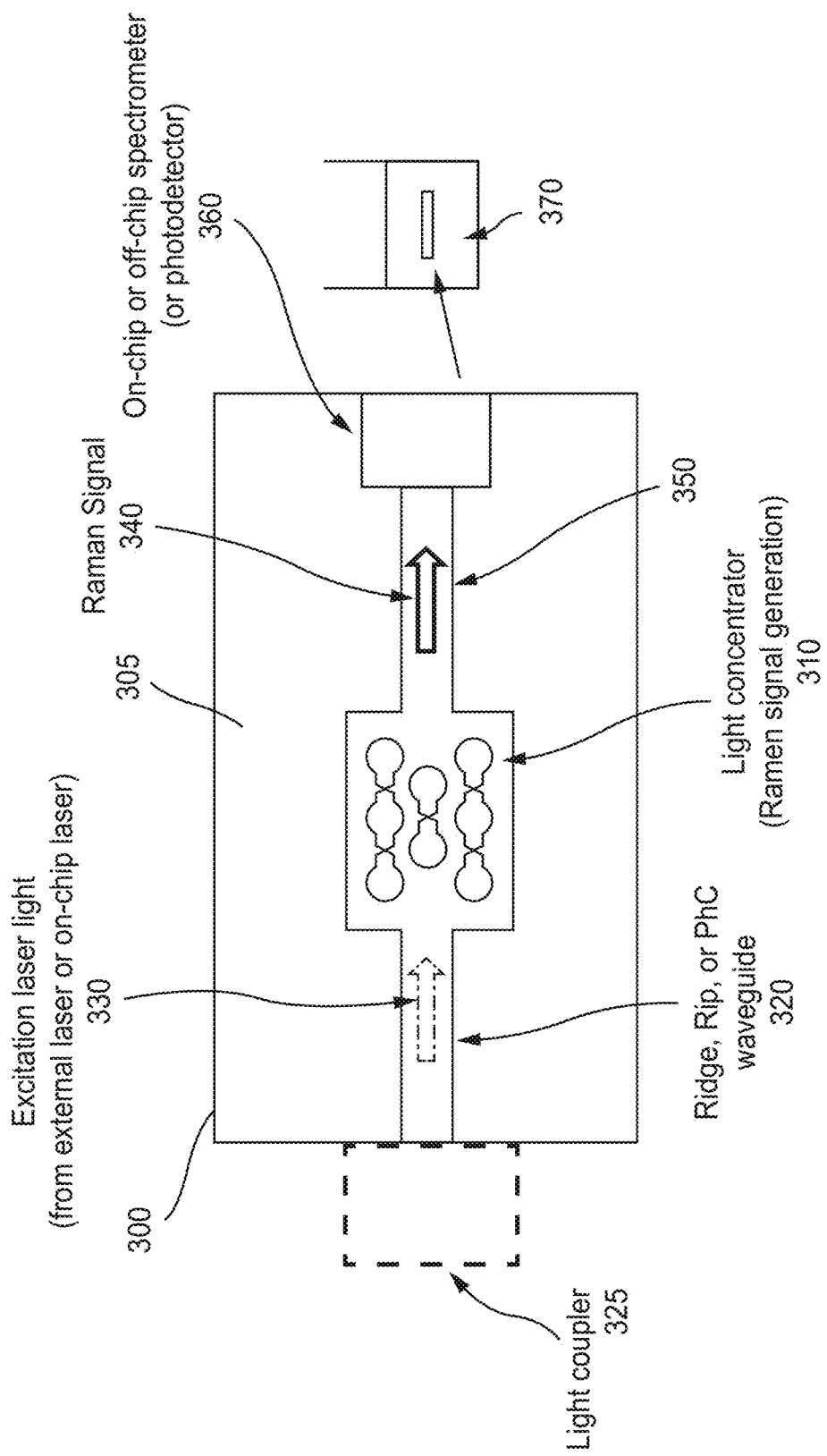
FIG. 3A illustrates an on-chip system for Raman spectroscopy using a dielectric cavity array like the one in FIG. 1.
Figure 3B:
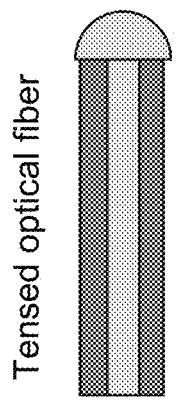
FIG. 3B illustrates an example light/optical coupler for use with the system of FIG. 3A.
Figure 3C:
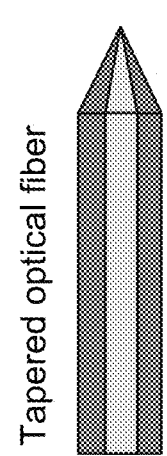
FIG. 3C illustrates another example light/optical coupler for use with the system of FIG. 3A.
Figure 3D:
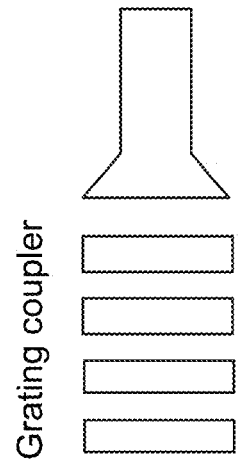
FIG. 3D illustrates yet another example light/optical coupler for use with the system of FIG. 3A.

FIG. 2 illustrates a side view of an example system 200 for Raman spectroscopy. In this setup, a dielectric cavity array 210, which may be structurally and/or functionally similar to the array 100 in FIG. 1, is immersed in a solution 220 that includes the sample (also referred to using the reference character '220') of interest to be analyzed. For example, the sample 220 can be dissolved, suspended, or sedimented on the surface of the array 100. A light source 230 (e.g., a laser) emits a Raman pump beam 240, which interacts with the array 210 and the sample 220, the interaction being enhanced due to the dielectric trip design as explained for FIG. 1. The emanating Raman signal 250, also enhanced due to the dielectric tip design, is detected by detector 260 such as, for example, a photodetector, a spectrometer, and/or the like. The molecules of the sample 220 can be present near the cavities due to (random) Brownian motion, or can be trapped near the cavity, such as by chemical tethering, adsorption (e.g., for gases), dipole trapping/optical tweezers, and/or the like.

FIG. 3 illustrates an example photonic chip 300 for Raman spectroscopy having a substrate 305, and that includes a dielectric array 310 integrally formed with the substrate. The array 310 can be structurally and/or functionally similar to the array 100. The chip 300 can be in contact with a sample such as, for example, immersed in a solution 370 including the sample, similar to the setup in FIG. 2. The array 310 is coupled to an input waveguide 320 that can be integrally formed with the substrate. The input waveguide 320, in turn, can receive the pump Raman beam from a light coupler 325. FIGS. 3B-3D illustrate different example light couplers 325 that can be employed, such as a tensed optical fiber (FIG. 3B), a tapered optical fiber (FIG. 3C), a grating coupler (FIG. 3D), and/or the like.

Referring again to FIG. 3A, The pump Raman beam 330 propagates along the waveguide 320, and the resulting Raman scattering signal 340 from the sample propagates along an output waveguide 350 to an on-chip detector 360 such as, for example, a photodetector, a spectrometer, and/or the like. In some cases, the component 350 can be an optical coupler (e.g., a fiber optic coupler) to transmit the signal 340 to an off-chip detector. The output waveguide 350 can be integrally formed with the substrate 305.

Dielectric Tip Enhanced Second Harmonic Generation

Silicon semiconductor devices find use in several important technologies, including integrated optics (e.g., passive optical devices) and photodetectors (e.g., active devices). Silicon is considered the most versatile substrate for such devices due to mature complementary metal-oxide-semiconductor (CMOS)-based technologies. However, the 1.12 eV (~1100 nm) bandgap of silicon makes it challenging to implement active devices such as photodetectors on the same substrate as passive devices. Specifically, the most common wavelength in optical communication systems is about 1550 nm, since most optical fibers have low or minimal loss at this wavelength. Photons at 1550 nm wavelength, however, cannot be detected by silicon-based devices since they cannot overcome the bandgap in silicon to affect signal generation. In contrast, because 775 nm photons have sufficient energy to overcome the bandgap of silicon and can be absorbed by silicon, enabling photodetection of these photons by silicon photodetectors. This suggests that an all-silicon device could guide photons at 1550 nm and detect them if they could be frequency-doubled to 775 nm.

Figure 4A:
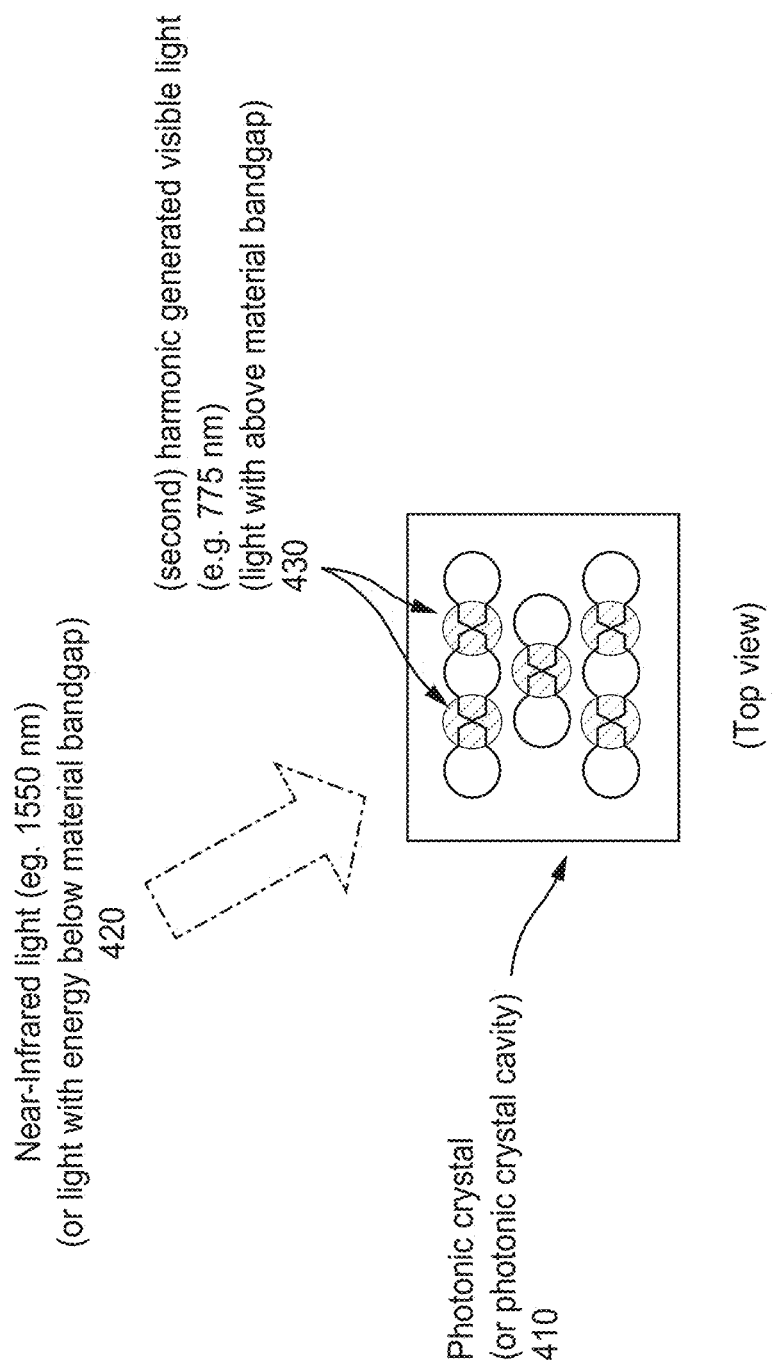
FIG. 4A illustrates a top view of dielectric cavity array for second harmonic generation.

FIG. 4A illustrates the general concept of using a dielectric tip array 410 (e.g., structurally and/or functionally similar to the array 100) for upconverting an input signal/photon 420 into an output signal/photon 430 at the dielectric tips of the array 400. Without being limited by any theory in particular, the input signal can be upconverted to the output signal via a nonlinear optic process. Materials with optical nonlinearities can be used as a substrate for the array 410, such that the input light signal, when passed through the material of the array, is converted to its harmonics. For example, in silicon-based integrated optics circuits, the array 400 can be used for second harmonic generation to up-convert two near-infrared (NIR) 1550 nm photons into a visible-light 775 nm photon. Second order nonlinearity of silicon can be induced by the electric field bias, so called DC-Kerr effect.

Figure 4B:
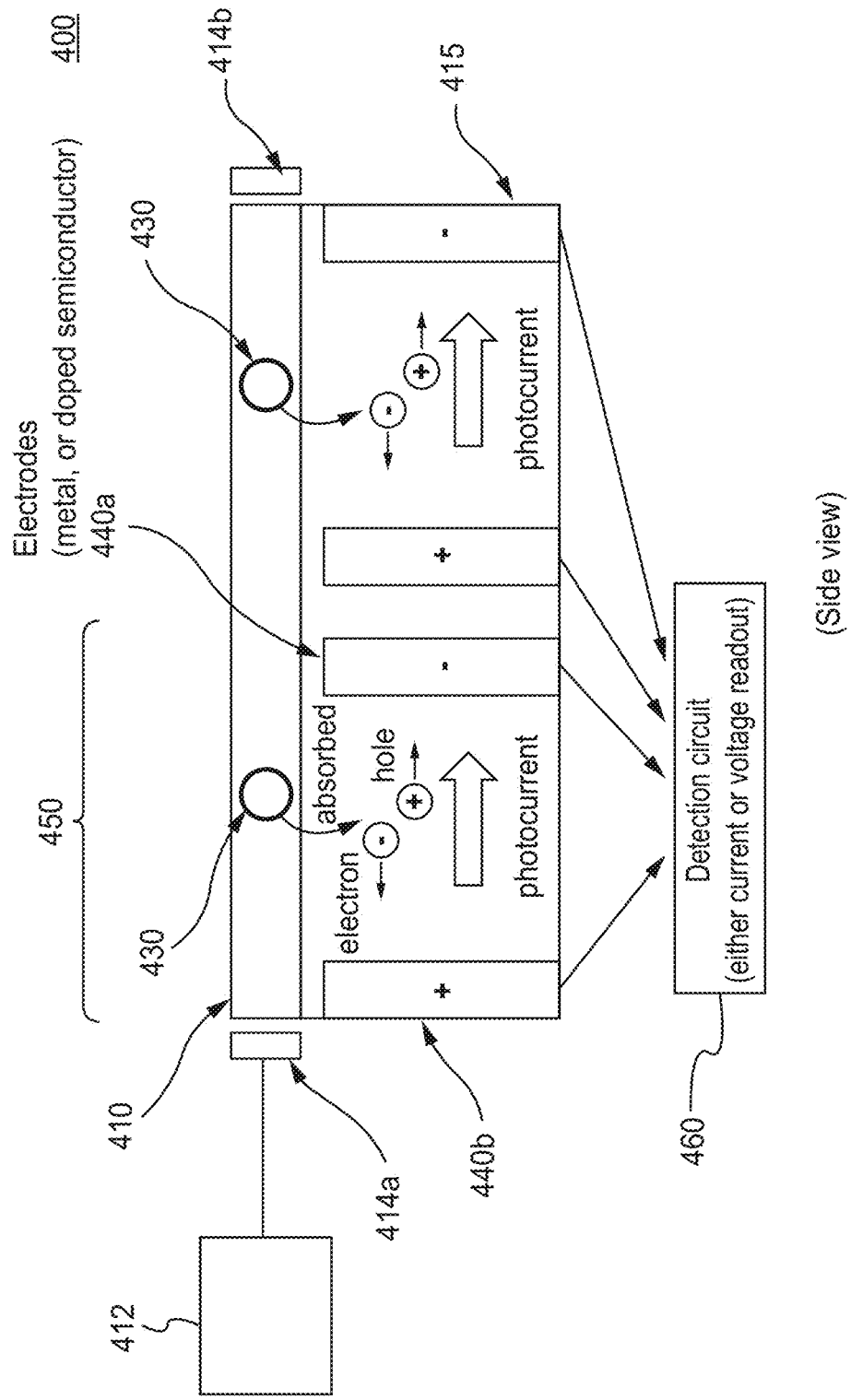
FIG. 4B illustrates a side view of a system for second harmonic generation using the dielectric cavity array of FIG. 4A.

FIG. 4B illustrates a second harmonic generation (SHG) and detection system 400. The system 400 includes the array 410 as a first SHG layer for up-converting incident photons to generated SHG photons 430. The array 410 can also include any suitable material for inducing second order, nonlinear behavior, such as lithium niobate for example. In some cases, the system 400 can include an electric field generator 412 to apply a direct current (DC) electric field to the array 410 via electrodes 414a, 414b, to induce the nonlinear behavior via the DC Kerr effect. The system 400 can also include a light source to generate the incident photons such as, for example, to generate a light beam having a wavelength of about 1000 nm, about 1200 nm, about 1500 nm, about 1800 nm, about 2200 nm, about 2300 nm, including all values and sub-ranges in between.

The system 400 also includes a second photodetection layer/array 415 for detecting the photons 430. The photodetection layer can include one or more detection units 450 such as, for example, a detection unit corresponding to each dielectric tip cavity of the array 410. In this manner, SHG photons generated at each cavity can be specifically and sensitively detected. As FIG. 4B illustrates, each detection unit 450 can be formed as a p-i-n junction including a set of electrodes 440a, 440b. During operation, generation of the SHG photon 430 at a dielectric tip can include a photocurrent in the detection unit 450 corresponding to that dielectric tip, which in turn can be detected via a detection circuit 460 of the system 400 or external to the system 400 that reads out the current and/or voltage from each detection circuit 460 of the detection layer 415.

Dielectric Tip Enhanced Field Emission

A dielectric nanotip/nanocavity, such as the tip 112/cavity 116 design illustrated in FIG. 1, can enhance an incident optical field significantly. By way of background, in conventional detectors, dynamics of carriers (electrons, holes, or both) are limited by some physical process, for example, carrier recombination happening on the order of nanoseconds (GHz). A tunneling process between dielectric tips on a nanometer scale, however, can be on the order of femtoseconds (~1 PHz). By virtue of this relatively quicker response, the bandwidth of a detector formed with the tip/cavity design illustrated in FIG. 1 can be much higher than conventional approaches. In some cases, the bandwidth of such a detector may be limited only by the tunneling process. In some cases, the SNR of the detector can be a factor in determining bandwidth, which may in such cases be about 1 THz or greater.

Figure 5A:
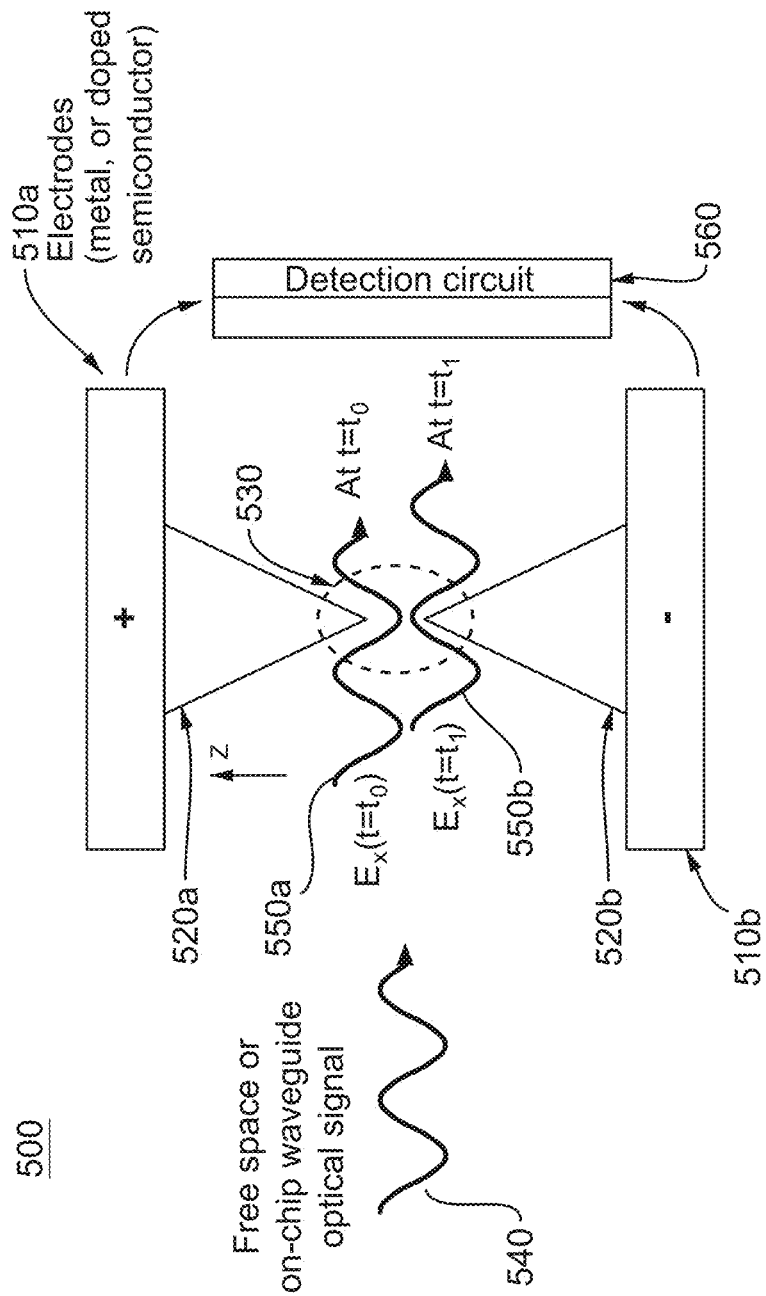
FIG. 5A illustrates a setup for detecting a light beam.

FIG. 5A illustrates a single setup 500 that includes a pair of tips 520a, 520b defining a cavity 530 for optical detection. A detector may include multiple such tips and associated cavities. The setup 500 may be part of an on-chip circuit, such as illustrated in FIG. 3.

The setup 500 includes electrodes 510a, 510b to generate a tunneling current between the tips 510a, 510b, such as via a voltage or current source coupled to the electrodes 510a, 510b. An optical signal 540, which may be free-space or delivered via a waveguide (e.g., similar to the input waveguide 320), can perturb the tunneling current, which in turn can be detected via a detection circuit 540. The modulation of the tunneling current is frequency dependent, i.e., the modification in the tunneling current due to the optical signal 550a present at time t=$t_0$ in the cavity 530 (or in the vicinity thereof) is different than due to the same optical signal 550b, at time t=$t_1$ (also shown in FIG. 5B) The output signal of the detection circuit 560 is then characterized by a signal pulse envelope that is modulated by the optical frequency of the optical signal 540. When the optical signal 540 includes ultrafast optical pulses, the resulting tunneling current can be an AC current in the THz range (e.g., detectable by the detection circuit 560), and accordingly useful for ultrafast detection of the optical signal 540, i.e., for forming ultrafast opto-electronic detectors.

Figure 5B:
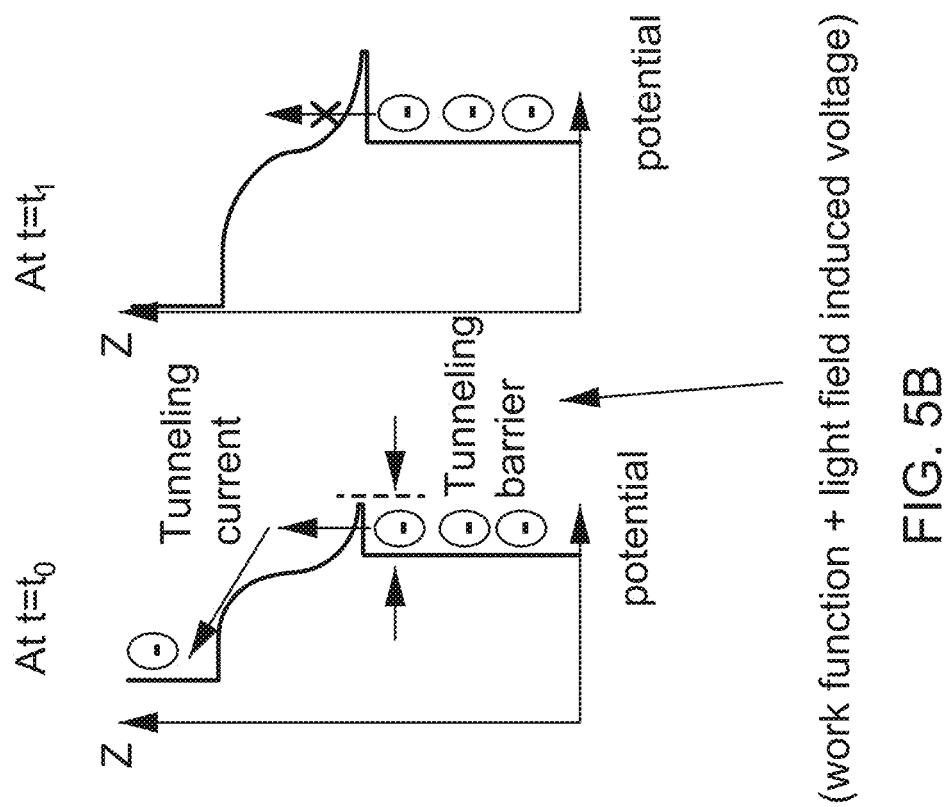
FIG. 5B illustrates how an optical signal can affect a tunneling barrier for the setup of FIG. 5A.

FIG. 5B generally illustrates how the tunneling barrier is determined both by the work function of the dielectric tips 520a, 520b, and the voltage induced by the optical signal 540. Variations in the optical signal 550a then vary the height of the tunneling barrier. The left plot in FIG. 5B shows the tunneling barrier for the optical signal 550a as being low enough to provide a detectable tunneling current. The right plot in FIG. 5B shows how the optical signal 550b raises the height of the tunneling barrier to the extent that no tunneling current exists.

FIGS. 6A-6C illustrates how ultrafast rectified photodetection, i.e. detection circuit 560, can be accomplished by coupling an additional RC circuit to the electrodes 520a, 520b. For ultrafast optical pulses, the frequency of the detection signal can be >100 THz. The detection circuit 560 can carry out detection of the optical signal by accumulating/integrating the tunneling current (e.g., by employing an RC circuit) and measuring the voltage generated from accumulated charges. For example, FIG. 6A illustrates the rectified optical signal. FIG. 6B illustrates the detection signal based on integrating the tunneling current responsive to the rectified optical signal. FIG. 6C illustrates when the optical signal is a pulsed signal. In this case, the peaks created from tunneling can changing based on the optical signal's envelope.

Figure 7:
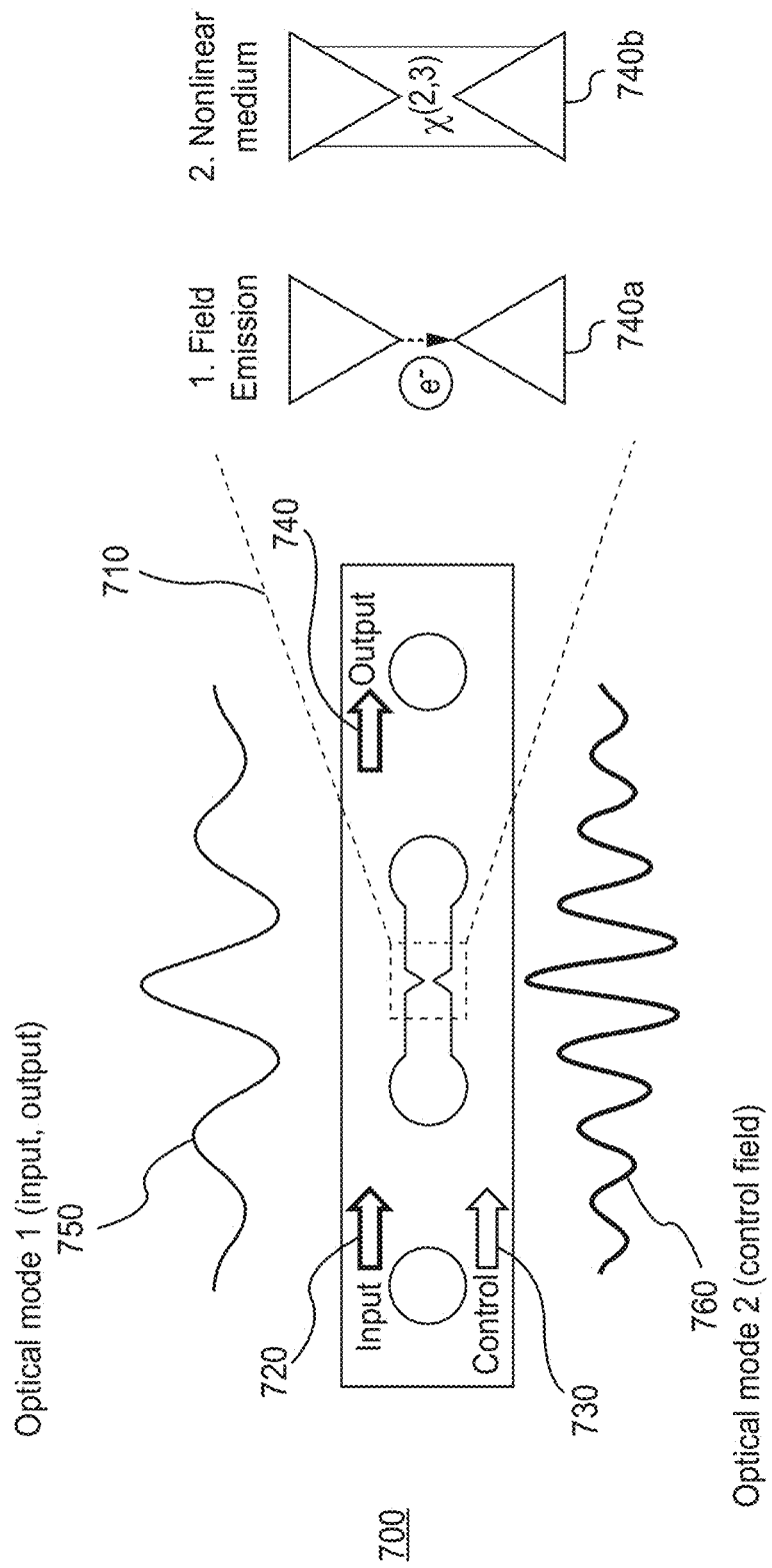
FIG. 7 illustrates a device for optical switching.

FIG. 7 illustrates another setup/device 700 for dielectric tip enhanced field emission. The device 700 is formed as a three port device with an input optical port 720, a control optical port 730, and an output optical port 740. The device 700 also includes a pair of tips forming a cavity (collectively, 710), which can be structurally and/or functionally similar to that described for FIG. 1. During use, when there is no control field/optical signal 760 applied at the control port 720, any optical signal applied via the input port (e.g., the signal 750) is off-resonant with respect to the cavity 710. Thus, the signal 750 is reflected from the cavity, and there is no, or negligible, light transmitted through the output port 740. However, when the control signal 760 is applied, either field emission (see illustration 740a) or nonlinearity (see illustration 740b) can change the resonance frequency of the cavity 710, which can be greater than the linewidth of the resonance of the cavity 710. Thus, the cavity is now in resonance with respect to the incoming light signal 750 from the input port 720, which is now transmitted to the output port 740. Said another way, the control field/signal 760 can control the transmission of light from the input port 720 to the output port 740. The device 700 can then function as an optical switching device, similar to how a transistor performs in the electrical domain. Due to the fast response of the cavity 710 to the control signal 760, ultrafast optical switching can be achieved when, for example, the control signal 760 includes ultrafast optical pulses.

Similarly, the device 700 can prevent or switch OFF the transmission of the signal 750 by the control field 76. In this configuration, the input field 750 is resonant with the device, yielding an output field at the output port 740. Said another way, the presence of the control field 730 changes the cavity resonance to be off-resonant with the input signal 750. This in turn reduces the transmission of the device 70.

FIGS. 8A and 8B show top and side views, respectively, of an example on-chip device 800, such as for light detection and/or switching, that incorporates the tip-electrode design of FIG. 5A. The device 800 includes multiple tips, and corresponding cavities (collectively, 810), that are coupled to each electrode 850a, 850b. An input waveguide 820 can deliver an input optical signal (not shown). The device 800 also includes an impedance-matching region 830 coupled to, and continuous with, the waveguide 820, which includes a gradual introduction of the tip/cavity design of FIG. 5A. The impedance-matching region 830 reduces reflection of the signal from the device 800. The impedance matching region 830 can approximately match the impedance of signal collection region 840 to the impedance of input waveguide 820 using adiabatic mode conversion. The device 800 then includes a signal collection region 840 that in turn includes the fully formed tips/cavities 810, as well as the electrodes 850a, 850b. The number of cavities can be selected based on, for example, the extent of adiabatic mode conversion desired. The device 800 exhibits reduced optical reflection and optical loss, enabling low power operation.

Dielectric Tip Enhanced Microwave-to-Optical Transduction

Superconducting qubits have several desirable properties, such as for making fast single/two-qubit gates. The rotations between the different energy levels of a single qubit are typically induced by microwave (MW) pulses. However, large energy losses and thermal excitation at MW frequencies in optical fibers have impeded development and incorporation of superconducting qubits into large scale quantum networks. Specifically, such networks require the use of optical fibers for signal transmission, since these typically have much lower losses (e.g., about 0.14 dB/km) when compared to electrical signals propagating through coaxial cables (e.g., about 0.1 dB/m), but the use of MW frequencies in such optical fibers is challenging as noted above.

Figure 9A:
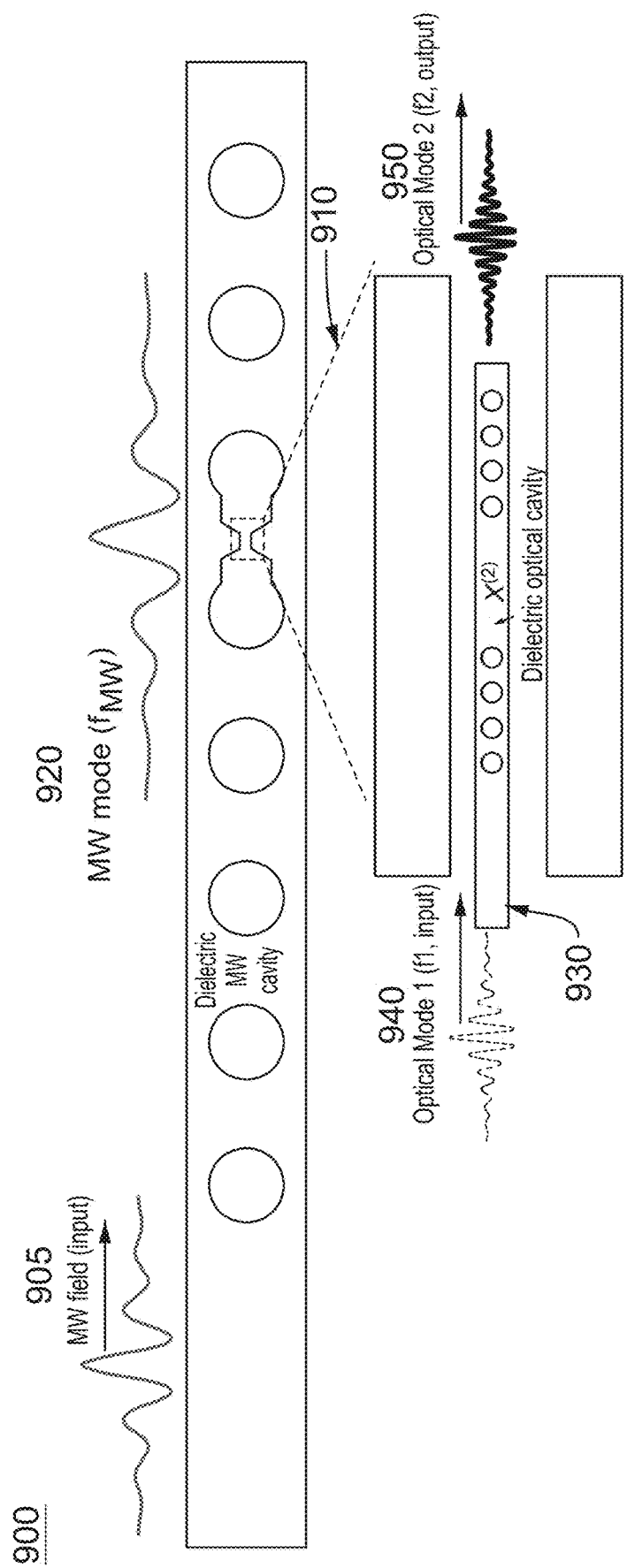
FIG. 9A illustrates a system for combining a microwave photon with an input optical photon to generate an output optical photon.
Figures 9B, 9C:
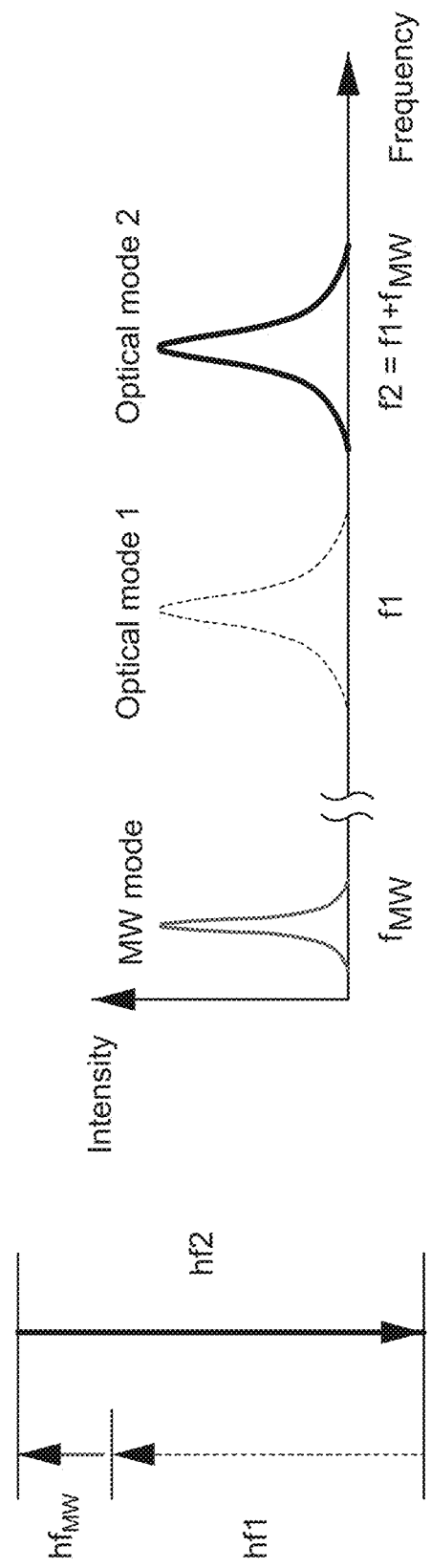
FIG. 9B illustrates an energy level diagram for combining a microwave photon with an input optical photon to generate an output optical photon.
FIG. 9C is a plot illustrating frequencies for the microwave photon, input optical photon, and output optical photon illustrated in FIGS. 9A and 9B.

FIG. 9A illustrates a device/system 900 for MW transduction, where a MW photon of an incident MW signal 905 is combined or summed with an optical photon and converted into, or used to generate, another optical photon using a dielectric optical cavity 930 disposed within a dielectric tip/cavity 910, which can be structurally and/or functionally similar to that illustrated for FIG. 1. FIG. 9B illustrates an energy level diagram, and shows how the combination of the microwave photon, having energy $hf_{MW}$, and the input optical photon, having energy hf1, enables a transition to a higher energy level, upon which the device 900 can release the output optical photon hf2 to return to the baseline energy level. In some cases (not shown), the interaction between the microwave photon and the input optical photon can be subtractive, such that the output photon attains a lower energy level than the input photon. FIG. 9C illustrates the frequency relationship between the MW photon, the input optical photon, and the output optical photon.

Referring again to FIG. 9A, the device 900 can be configured as a MW resonator that can store MW photons. The device/resonator 900 defines a microwave cavity 910 between a pair of tips (also referred to with reference number 910), which in turn can have a dielectric optical cavity (e.g., a doubly resonant optical cavity) 930 disposed in it. While a single microwave cavity is shown here, in come cases, the device 900 can include multiple cavities similar to the cavity 910, each formed by its corresponding pairs of tips, and each having a corresponding optical cavity disposed in it.

FIG. 9A illustrates that the device 900 includes three electromagnetic (EM) modes overall: a MW mode 920, an optical input mode 940, and an optical output mode 950. A photon in input mode 940 can be converted into a photon in the output mode 950 by employing a MW photon of the MW signal 905, such as through second order nonlinearity ($\chi^2$) of the material of the optical cavity 930. The incorporation of the dielectric tip/cavity 910 in the device 900 can enhance the interaction of the microwave photon and the input mode photon.

The internal conversion efficiency of this process is given by $$\eta_i = 4C/(1+C)^2, \quad C = 4n_1 g^2/\kappa_2 \kappa_{MW}$$

where $n_1$ is the number of the photons in the input mode 940, g is the coupling coefficient proportional to the three modes (MW mode, input mode, and output mode), $\kappa_2$ and $\kappa_{MW}$ are the dissipation rates of the output mode and the device cavity modes, respectively. Generally, there can be two challenges in converting a single MW photon into a single optical photon. First, a MW mode is typically several orders of magnitude larger in wavelength than an optical mode, limiting mode overlap and consequently the coupling coefficient, g. Second, a typical MW cavity is usually made of metal or lumped elements, which are lossy, limiting the quality factor ($Q_{MW} = \omega_{MW}/\kappa_{MW}$) to on the order of $10^4$. Incorporating the dielectric tip/cavity 910 leads to higher conversion efficiency through a larger coupling coefficient g and smaller MW dissipation rate $\kappa_{MW}$, leading to an increased quality factor $Q_{MW}$. For transduction, tips can be added to the cavity with larger volume, since the mode overlap can be the relevant figure of merit. Without being limited by any theory in particular, a mode overlap factor can be increased, relative to the optical cavity being disposed elsewhere in the device 900 (e.g., in a hole of the lattice structure of the device 900). The mode overlap factor can increase from $$\sim \left(\frac{\lambda_{MW}}{\lambda}\right)^3$$

in such a setup to $$\sim \frac{V_{eff,MW}}{\left(\frac{\lambda_{MW}}{n_{MW}}\right)^3} \left(\frac{\lambda_{MW}}{\lambda}\right)^3$$

in the setup of FIG. 9, where $\lambda_{MW}(\lambda)$ is the wavelength of the microwave (optical) field, $V_{eff,MW}$ is the effective mode volume of the microwave mode, $n_{MW}$ is the refractive index of the material of the MW cavity at the microwave frequency.

Dielectric Tip Enhanced Light Emitting Sources

Figure 10:
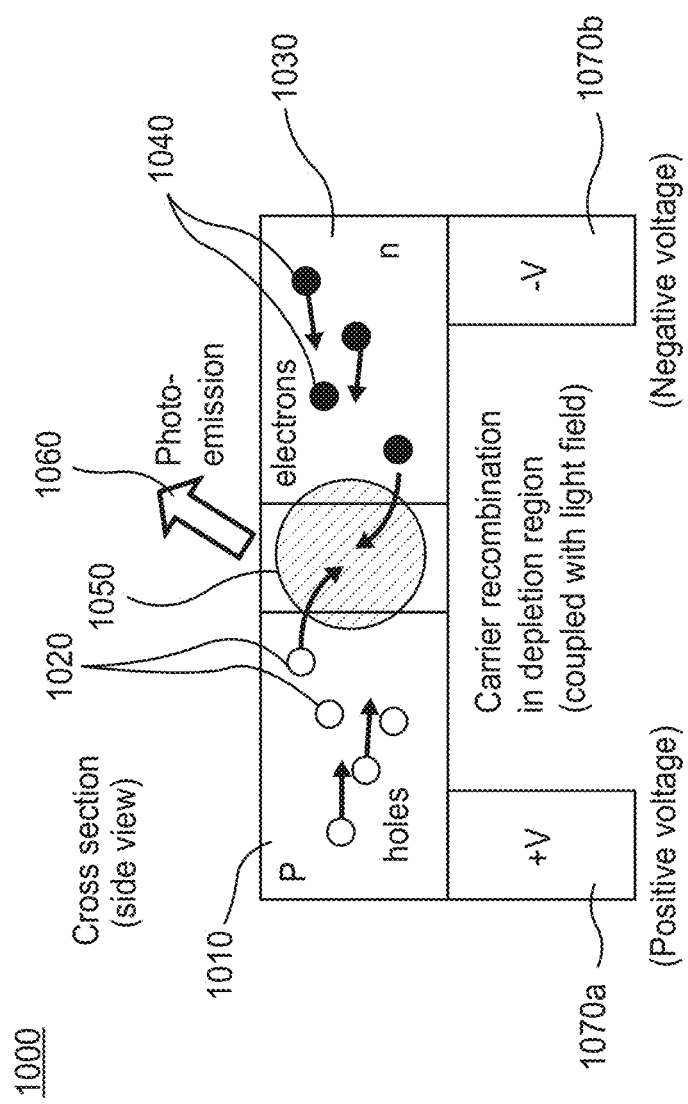
FIG. 10 illustrates a side view of a light emitting device within a dielectric cavity array.
Figure 11:
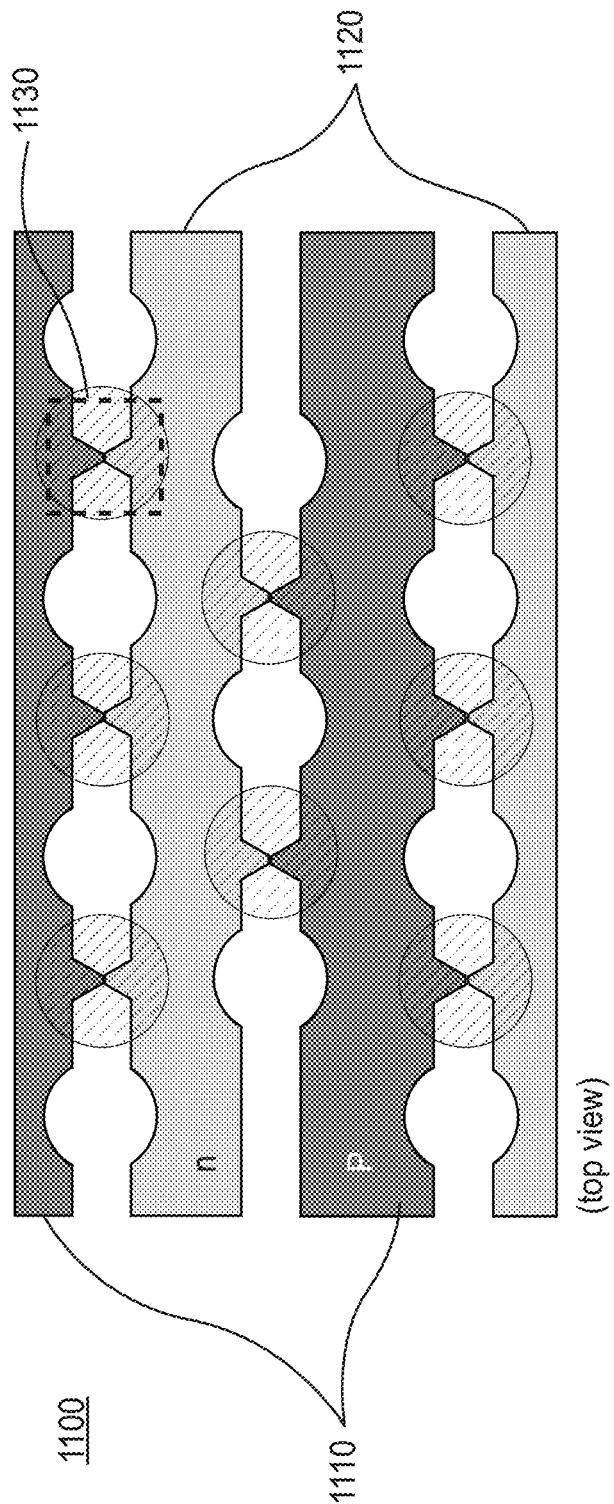
FIG. 11 illustrates another setup for a dielectric cavity array operating as a light emitting device.
Figure 12:
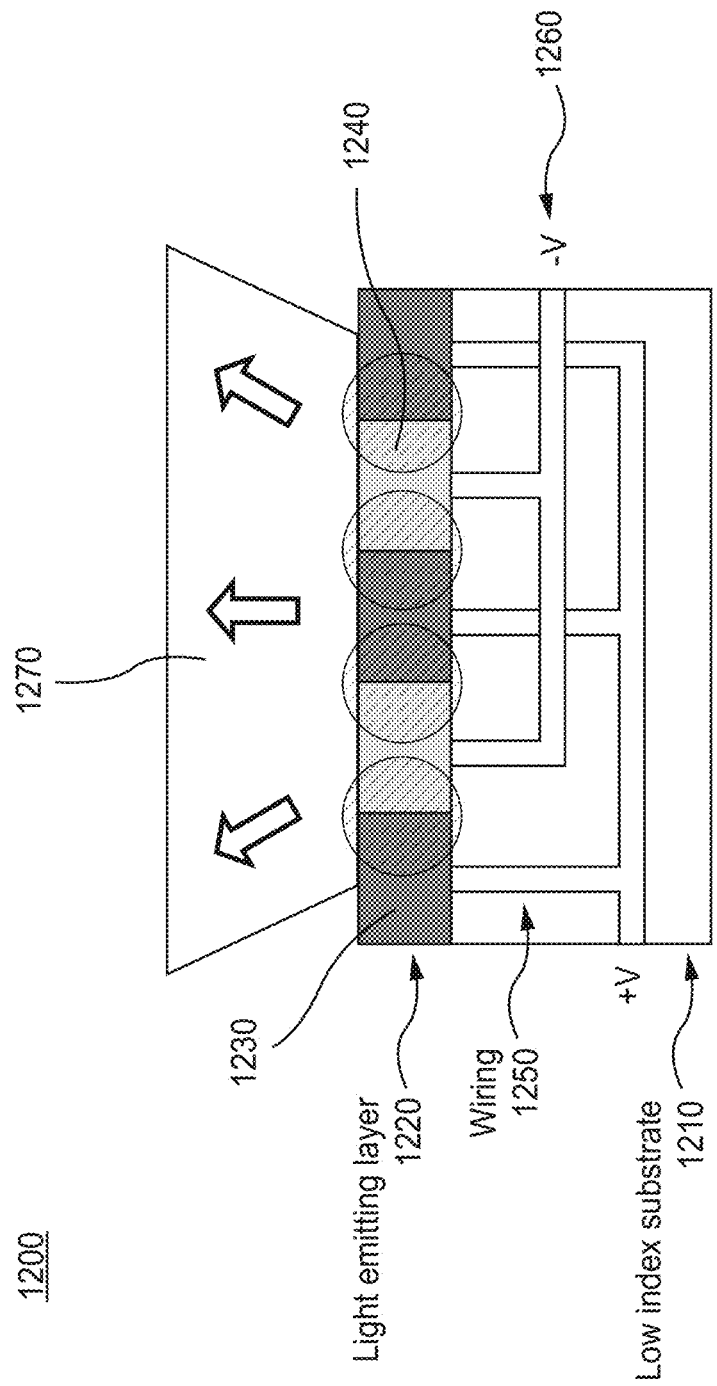
FIG. 12 illustrates yet another setup for a dielectric cavity array operating as a light emitting device.

FIGS. 10-12 generally illustrate light emitting devices/sources that include a dielectric tip/cavity structure as generally illustrated in FIG. 1. By way of explanation, FIG. 10 illustrates a single light emitting device 1000 that includes a p-type doped region 1010, an n-type doped region 1030, and a depletion region 1050. Electrodes 1070a, 1070b couple of the regions 1010, 1030 respectively to deliver power. FIG. 10 further illustrates how, for photo-emission, electrons 1040 and holes 1020 in the doped regions 1010, 1030 combine at the depletion region 1050 to generate a photo-emission 1060. The emission 1060 can generally be incoherent in nature, with each electron-hole recombination resulting in a photon emission, such that multiple photons can be emitted from the depletion region 1050 upon multiple recombinations. The emission 1060 can, in some cases, be substantially similar to that of LEDs. The angular distribution of the emission 1060 (e.g., from an NA of about 0.5 to an NA of about 1, including all values and sub-ranged in between) can be manipulated and/or adjustable, such as by the inclusion of beam forming elements on the device 1000, by the design of the device 1000 itself, etc.

The photo-emission rate can be based on the local optical density of states (LDOS) at the point where recombination happens, i.e., in the depletion region 1050. The LDOS is proportional to the strength of the light field of the cavity at that position. When a dielectric tip/cavity design as illustrated in FIG. 1 is employed (i.e., with the regions 1010, 1030 forming the dielectric tips and the depletion region being defined by the cavity), it enhances the field strength at the dielectric cavity/depletion region and the carriers 1020, 1040 can recombine at a faster rate (especially when in a vacuum setting), resulting in an efficient light source.

FIG. 11 illustrates a light emitting device 1100 that includes alternating/interspersed n- and p-type layers/substrates 1110, 1120 respectively. The substrates 1110, 1120 each define multiple dielectric tips, and pairs of tips 1130, one on each substrate, align to define cavities (also referred to as '1130'). A first electrode (not shown) can be coupled to the n-type layers 1110 and a second electrode (not shown) can be coupled to the p-type layers 1120. A power source (not shown) coupled to the electrodes can apply power to the electrode, which in turn drives carriers in the layers 1110, 1120 to recombine in the region of the cavities 1130, resulting in generation of a light beam at each cavity 1130. The device 1100 can function as a multi-light source, or the light generated at each cavity 1130 can be optically combined to yield a single light beam. When the device 1100 is a multi-light source, the voltage connected to each light emitting region can be adjusted to control emission at each cavity 1130 individually (See FIG. 12) such as to, for example, tune at least some of the sources/cavities 1130 to different emission wavelengths.

FIG. 12 illustrates a light emitting device 1200 that includes a light generation layer 1220 including alternating n-type regions 1230 and p-type regions 1240. The layer 1200 may be structurally and/or functionally similar to the device 1100 include dielectric tips/cavities formed between the regions 1230, 1240 (not visible in the side-view shown in FIG. 12). The device 1200 also includes a control layer 1210 that includes a first set of control lines 1250 for the n-type regions 1230, and a second set of control lines 1260 for the p-type regions. Application of power through the control lines 1250, 1260 results in carrier recombination in the dielectric cavities of the layer 1220 and result in photo-emission 1270.

Light field enhancement via inclusion of a dielectric tip/cavity can provide several benefits over conventional devices, including more efficient carrier to photon conversion due to increased density of carriers in the cavity region, and due to the Purcell effect.

CONCLUSION

All parameters, dimensions, materials, and configurations described herein are meant to be exemplary and the actual parameters, dimensions, materials, and/or configurations will depend upon the specific application or applications for which the inventive teachings is/are used. It is to be understood that the foregoing embodiments are presented primarily by way of example and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein.

In addition, any combination of two or more such features, systems, articles, materials, kits, and/or methods, if such features, systems, articles, materials, kits, and/or methods are not mutually inconsistent, is included within the inventive scope of the present disclosure. Other substitutions, modifications, changes, and omissions may be made in the design, operating conditions and arrangement of respective elements of the exemplary implementations without departing from the scope of the present disclosure. The use of a numerical range does not preclude equivalents that fall outside the range that fulfill the same function, in the same way, to produce the same result.

Also, various inventive concepts may be embodied as one or more methods, of which at least one example has been provided. The acts performed as part of the method may in some instances be ordered in different ways. Accordingly, in some inventive implementations, respective acts of a given method may be performed in an order different than specifically illustrated, which may include performing some acts simultaneously (even if such acts are shown as sequential acts in illustrative embodiments).

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A dielectric cavity array disposed in contact with a sample generating a Raman scattering signal in response to a Raman pump beam, comprising:
    a plurality of tips; and
    a plurality of cavities, each cavity of the plurality of cavities defined by a pair of tips of the plurality of tips and having a mode volume from about $10^{-1}\lambda^3$ to about $10^{-6}\lambda^3$ and a quality factor from about $10^2$ to about $10^7$, to concentrate the Raman pump beam in the vicinity of each cavity, and to enhance the Raman scattering signal generated by the sample in the vicinity of each cavity.

2. The dielectric cavity of claim 1, wherein the mode volume is from about $10^{-2}\lambda^3$ to about $10^{-5}\lambda^3$.

3. The dielectric cavity of claim 1, wherein the quality factor is from about $10^3$ to about $10^6$.

4. A system for Raman spectroscopy, comprising:
    a light source to generate a Raman pump beam to excite a sample, wherein the sample generates a Raman scattering signal in response to the Raman pump beam;
    the dielectric cavity array claim 1 disposed in contact with the sample, to concentrate the Raman pump beam in the vicinity of each cavity, and to enhance the Raman scattering signal generated by the sample in the vicinity of each cavity; and
a detector to detect the Raman scattering signal.

5. The system of claim 4, wherein the sample is adsorbed on a surface of the dielectric cavity array.

6. The system of claim 4, wherein the sample is trapped on a surface of the dielectric cavity array.

7. The system of claim 4, further comprising a substrate having the dielectric cavity array and the detector embedded or integrated therein, the substrate further comprising:
an input waveguide, integrated into the substrate and in optical communication with the light source and the dielectric cavity array, to deliver the Raman pump beam to the dielectric cavity array.

8. The system of claim 7, wherein the substrate further comprises:
an output waveguide, embedded in the substrate in optical communication with the dielectric cavity array and the detector, to guide the Raman scattering signal to the detector.

9. The system of claim 7, wherein the detector is integrated with the substrate.

10. The system of claim 7, wherein the sample includes a liquid medium, and wherein the substrate is configured for submersion in the liquid medium.

11. A system for second harmonic generation and detection, comprising:
a light source to generate a light beam having a wavelength from about 1100 nm to about 2200 nm;
a dielectric cavity array including a plurality of tips and a plurality of cavities, each cavity of the plurality of cavities defined by a pair of tips of the plurality of tips and having a mode volume from about $10^{-2}\lambda^3$ to about $10^{-5}\lambda^3$ and a quality factor from about $10^3$ to about $10^6$, to generate a second harmonic frequency light from the light at each cavity; and
a photodetector array coupled to the dielectric cavity array and including a plurality of photodetectors, each photodetector in optical communication with a corresponding cavity of the plurality of cavities, to generate a photocurrent in response to the second harmonic light beam generated at the corresponding cavity.

12. The system of claim 11, further comprising a detection circuit coupled to the photodetector array, to generate a current measure, a voltage measure, or both, based on the photocurrent.

13. A system for detecting a light beam, comprising:
a first electrode;
a first dielectric tip coupled to the first electrode;
a second electrode;
a second dielectric tip coupled to the second electrode, wherein the first dielectric tip and the second dielectric tip collectively define a first cavity having a mode volume from about $10^{-2}\lambda^3$ to about $10^{-5}\lambda^3$ and a quality factor from about $10^3$ to about $10^6$ to interact with the light; and
a circuit, coupled to the first electrode and the second electrode, to generate an output signal in response to the modulation of a tunneling current across the first cavity between the first electrode and the second electrode by the light beam.

14. The system of claim 13, wherein the circuit is further configured to apply a voltage bias to the first electrode and the second electrode to generate a rectified form of the output signal.

15. The system of claim 13, wherein the circuit includes an RC component to integrate the output signal.

16. The system of claim 13, further comprising:
a first set of dielectric tips coupled to the first electrode and including the first dielectric tip;
a second set of dielectric tips coupled to the second electrode and including the second dielectric tip, wherein the first set of dielectric tips and the second set of dielectric tips collectively define a set of cavities including the first cavity;
a waveguide optically coupled to the set of cavities for delivering the light beam to the set of cavities.

17. A system for transducing microwave energy to optical energy, comprising:
a resonator to store a microwave photon; and
a doubly resonant optical cavity to receive a first optical photon at a first wavelength,
wherein the resonator includes a microwave cavity defined by a pair of tips, the microwave cavity having mode volume from about $10^{-2}\lambda^3$ to about $10^{-8}\lambda^3$ and a quality factor from about $10^3$ to about $10^6$, to convert, in the microwave cavity, the microwave photon and the first optical photon into a second optical photon at a second wavelength shorter or longer than the first wavelength.

18. The system of claim 17, wherein the microwave cavity is a first microwave cavity, and wherein the resonator defines a plurality of microwave cavities including the first microwave cavity, each microwave cavity of the plurality of microwave cavities being defined by a corresponding pair of tips.

19. The system of claim 17, wherein a mode overlap between an optical mode of the optical cavity and a microwave mode of the resonator is increased relative to a mode overlap between the optical mode of the optical cavity and the microwave mode of the resonator when the optical cavity is disposed in a hole of the resonator, by a factor based on a ratio of a mode volume of the microwave mode to cube of a wavelength of the microwave photon.

20. A system, comprising:
a light source, including:
a first substrate composed of a p-type semiconductor material and including a first plurality of tips;
a second substrate composed of an n-type semiconductor material and including a second plurality of tips, the first substrate and the second substrate arranged such that the first plurality of tips and the second plurality of tips align to define a plurality of cavities, each cavity having a mode volume from about $10^{-2}\lambda^3$ to about $10^{-5}\lambda^3$ and a quality factor from about $10^3$ to about $10^6$;
a first electrode electrically coupled to the first substrate;
a second electrode electrically coupled to the second substrate; and
a power source coupled to the first electrode and the second electrode, to apply power to the first electrode and the second electrode, wherein carrier recombination in the plurality of cavities in response to the application of power generates a light beam.

21. The system of claim 20, the light source further including:
a first plurality of p-type substrates including the first substrate and electrically coupled to the first electrode; and a a second plurality of n-type substrates including the second substrate and electrically coupled to the second electrode, the first plurality of p-type substrates interspersed with the second plurality of n-type substrates.

22. A device for optical switching, comprising:

a substrate including a cavity defined by a pair of tips, the cavity having a mode volume from about $10^{-2}\lambda^3$ to about $10^{-5}\lambda^3$ and a quality factor from about $10^3$ to about $10^6$;

a control port optically coupled to the cavity, to receive and apply a control signal to the cavity to change a resonance frequency of the cavity;

an input port optically coupled to the cavity, to receive and apply an input optical beam to the cavity; and an output port optically coupled to the cavity, such that when, based on the control signal:

the cavity is in resonance with the input optical beam, the input optical beam is transmitted through the cavity and received at the output port as an output optical beam; and the cavity is off-resonant with the input optical beam, the input optical beam is reflected at the cavity and not transmitted through to the output port.

23. The device of claim 22, wherein the control port, the input port, and the output port are formed on the substrate.

24. The device of claim 22, wherein the control signal includes ultrafast optical pulses.

* * * * *